(12) United States Patent
Shim

(10) Patent No.: US 9,637,665 B2
(45) Date of Patent: May 2, 2017

(54) ADHESIVE FILM AND MANUFACTURING METHOD OF THE SAME, AND DISPLAY DEVICE INCLUDING THE ADHESIVE FILM

(71) Applicant: Samsung Display Co., Ltd., Yongin (KR)

(72) Inventor: Jin Bo Shim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 87 days.

(21) Appl. No.: 14/546,391

(22) Filed: Nov. 18, 2014

(65) Prior Publication Data
US 2015/0144913 A1  May 28, 2015

(30) Foreign Application Priority Data

Nov. 28, 2013 (KR) .................. 10-2013-0145936

(51) Int. Cl.
| | | |
|---|---|---|
| H01L 51/52 | (2006.01) | |
| C09J 7/00 | (2006.01) | |
| C09J 5/00 | (2006.01) | |
| H01L 27/32 | (2006.01) | |
| G02B 5/30 | (2006.01) | |

(52) U.S. Cl.
CPC . *C09J 7/00* (2013.01); *C09J 5/00* (2013.01); *H01L 27/323* (2013.01); *C09J 2201/40* (2013.01); *C09J 2203/326* (2013.01); *C09J 2205/31* (2013.01); *C09J 2433/00* (2013.01); *G02B 5/3025* (2013.01); *H01L 51/5237* (2013.01); *H01L 51/5246* (2013.01); *H01L 2251/5338* (2013.01); *Y10T 428/24802* (2015.01)

(58) Field of Classification Search
None
See application file for complete search history.

(56) References Cited

U.S. PATENT DOCUMENTS

| | | | |
|---|---|---|---|
| 5,880,800 A | | 3/1999 | Mikura et al. |
| 9,333,725 B2* | | 5/2016 | Chuang ............... B32B 7/14 |
| 2012/0214936 A1* | | 8/2012 | Fujita ................. C09J 7/0246 |
| | | | 524/548 |
| 2013/0059105 A1 | | 3/2013 | Wright et al. |
| 2013/0153270 A1* | | 6/2013 | Hung ................ H05K 1/0277 |
| | | | 174/254 |
| 2014/0071353 A1* | | 3/2014 | Nashiki ............. G02F 1/13338 |
| | | | 349/12 |
| 2015/0004345 A1* | | 1/2015 | Chaung ................ C09J 5/06 |
| | | | 428/41.7 |

FOREIGN PATENT DOCUMENTS

| | | |
|---|---|---|
| JP | 2010039170 | 2/2010 |
| KR | 100444412 | 11/2004 |
| KR | 1020070007418 | 1/2007 |
| KR | 1020070083420 | 8/2007 |

* cited by examiner

Primary Examiner — Hoang-Quan Ho
(74) Attorney, Agent, or Firm — H.C. Park & Associates, PLC

(57) ABSTRACT

An adhesive film that includes a first region having a first hardness, and second regions disposed on opposing sides of the first region and having a second hardness that is greater than the first hardness.

7 Claims, 14 Drawing Sheets

US 9,637,665 B2

ADHESIVE FILM AND MANUFACTURING METHOD OF THE SAME, AND DISPLAY DEVICE INCLUDING THE ADHESIVE FILM

CROSS-REFERENCE TO RELATED APPLICATION

This application claims priority from and the benefit of Korean Patent Application No. 10-2013-0145936, filed on Nov. 28, 2013, which is hereby incorporated by reference for all purposes as if fully set forth herein.

BACKGROUND

Field

The present invention relates to an adhesive film and a manufacturing method thereof, and a display device including the adhesive film.

Discussion of the Background

Recently, a flexible display device, including a flexible substrate that is lightweight and impact resistant, has been developed. The flexible display device can be bent or rolled to maximize portability and may be applied to various fields.

The flexible display device includes display elements formed on the flexible substrate. Examples of the display elements include an organic light emitting diode display element, a liquid crystal display element, and an electrophoretic display (EPD) element.

The display elements each may include a thin film transistor. Therefore, the flexible substrate may be subjected to several thin film processes, in order to form the flexible display device.

In addition, the flexible substrate that is subjected to the thin film process is sealed by an encapsulation substrate. The flexible substrate, the thin film transistor formed on the flexible substrate, and the encapsulation substrate constitute a display panel of the flexible display device.

However, when the flexible display device is bent, rolled, or folded, the display panel receives bending stress. If bending stress of more than a predetermined degree is applied to the display panel, damage such as cracking may occur in the thin film transistor or the light emitting element in the display panel.

The above information disclosed in this Background section is only for enhancement of understanding of the background of the invention and therefore it may contain information that does constitute prior art.

SUMMARY

Exemplary embodiments of the present invention provide an adhesive film and a manufacturing method thereof, having advantages of being capable of absorbing and/or dispersing stress caused by bending.

Exemplary embodiments of present invention also provide a display device having advantages of being capable of preventing cracks and the like from being generated on a display panel, by controlling stress caused by bending of the display device.

Additional features of the invention will be set forth in the description which follows, and in part be apparent from the description, or may be learned by practice of the present invention.

An exemplary embodiment of the present invention provides an adhesive film including a first region having predetermined hardness, and second regions having a hardness that is higher than the hardness of the first region.

Another exemplary embodiment of the present invention provides an adhesive film having hardness that is gradually increased from the center to edges thereof.

Yet another exemplary embodiment of the present invention provides a manufacturing method of an adhesive film, including: coating an adhesive material on a support substrate; selectively hardening the adhesive film to form an adhesive layer; and separating the support substrate from the adhesive layer.

Yet another exemplary embodiment of the present invention provides a display device, including: a substrate; a protective film disposed on a first side of the substrate; a display panel disposed on a second side of the substrate; a touch panel disposed on the display panel; a polarizer disposed on the touch panel; a window disposed on the polarizer; a first adhesive film disposed between the substrate and the protective film; and a second adhesive film disposed between the display panel and the touch panel. The first and second adhesive films include a first region having a first hardness and second regions having a second hardness that is higher than the first hardness.

According to the adhesive film in accordance with the exemplary embodiments of the present invention, it is possible to absorb and/or disperse stress in various regions of the adhesive film, to prevent damage and/or cracks to other constituent elements, when bending occurs.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
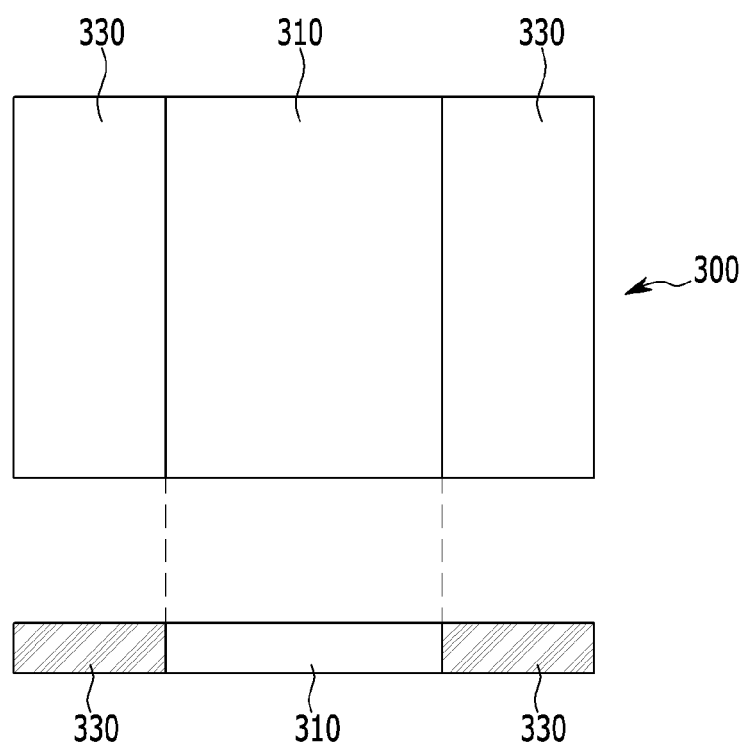
FIG. 1 is a top plan view and a cross-sectional view showing an adhesive film in accordance with a first exemplary embodiment.

Hereinafter, exemplary embodiments of the present invention will be described in detail with reference to the accompanying drawings. As those skilled in the art would realize, the described embodiments may be modified in various different ways, all without departing from the spirit or scope of the present invention. On the contrary, exemplary embodiments introduced herein are provided to make disclosed contents thorough and complete, and sufficiently transfer the spirit of the present invention to those skilled in the art.

In the drawings, the thickness of layers and regions may be exaggerated for clarity. In addition, when a layer is described to be formed on another layer or on a substrate, this means that the layer may be formed directly on the other layer or on the substrate, or a third layer may be interposed between the layer and the other layer or the substrate. Like numbers refer to like elements throughout the specification. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Referring to FIG. 1, an adhesive film 300 in accordance with a first exemplary embodiment of the present disclosure. The adhesive film 300 operates as a film for adhering various layers stacked in a display device to one other, and can absorb stress focused on a central portion thereof due to bending of the display device.

The adhesive film 300 includes a first region 310 and second regions 330. The first region 310 is formed at a central portion of the adhesive film 300. The second regions 330 are disposed at opposite sides of the first region 310, along a bending direction of the adhesive film 300. In other words, the second regions 330 are disposed at edges of the adhesive film 300, along the bending direction thereof. In this case, the first region 310 and the second regions 330 are formed to have different hardnesses. Herein, a "bending direction" refers to a direction along which an element is configured to bend, and the bending direction may correspond to the length direction of the element.

In the present exemplary embodiment, the hardness of the second regions 330 is higher than that of the first region 310. In other words, the hardness of the central portion of the adhesive film 300 is lower than that at the edge portions thereof.

Figure 7:
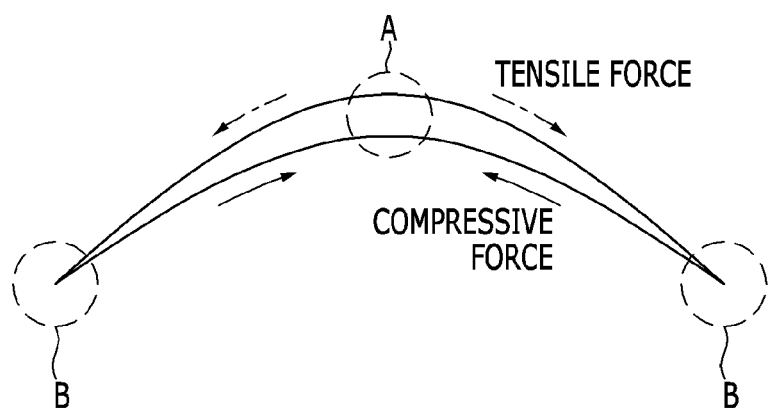
FIG. 7 shows a tensile force and a compressive force generated in a bent display device.

In general, as shown in FIG. 7, when a plate-like member is bent with respect to the center in a direction, a compressive force is internally applied in the bending direction, while a tensile force is externally applied. Moreover, higher stress is generated at a central portion A than at edge portions B. This is verified by the following measurement results.

Figure 8:
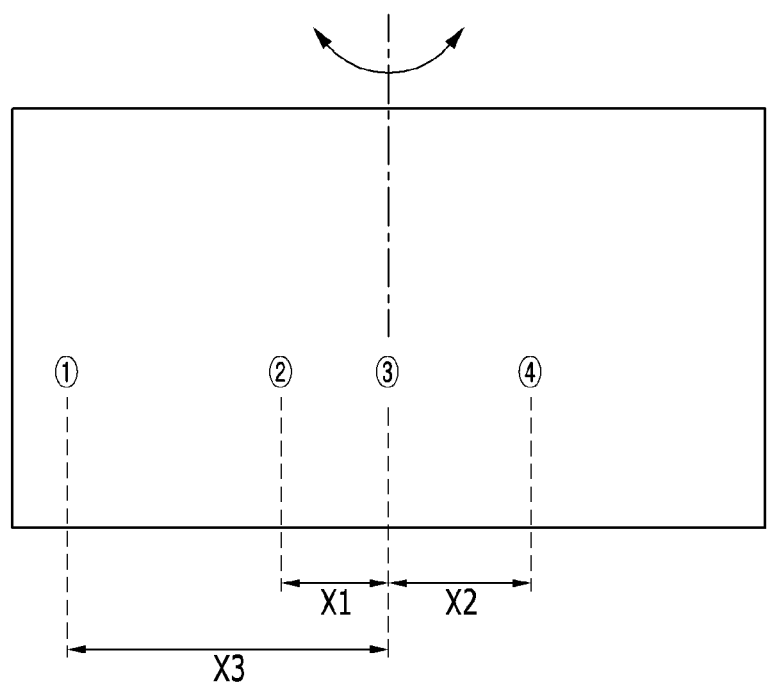
FIG. 8 and FIG. 9 show results of measuring a displacement depending on a position of the bent display device.
Figure 9:
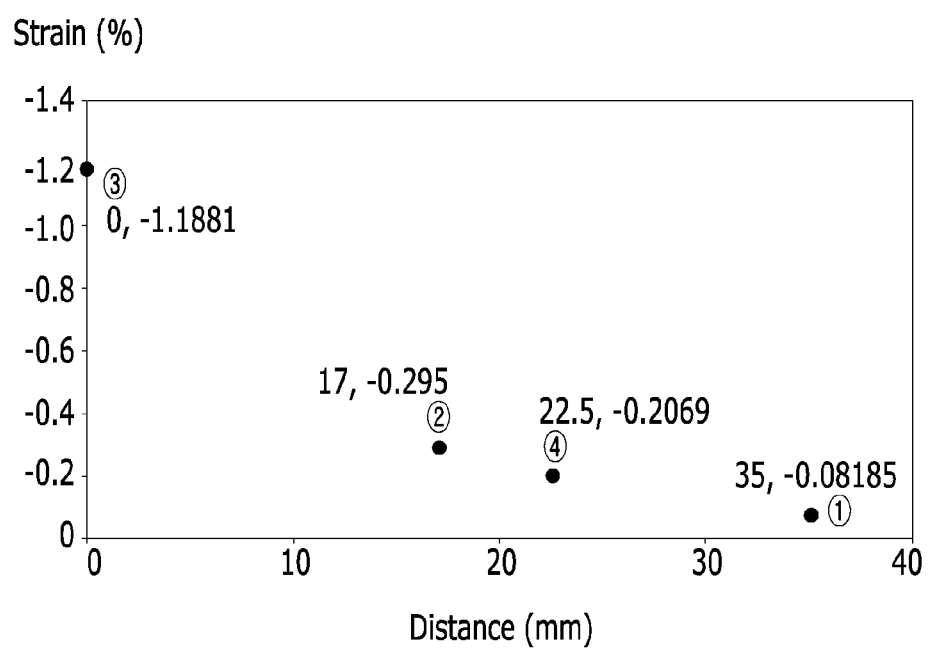

FIG. 8 and FIG. 9 show results of measuring a displacement depending on a position of the bent display device. Referring to FIG. 8 and FIG. 9, as a display device or a specific layer constituting the display device is bent with respect to the center, the measurement is performed at each point thereof.

As shown in FIG. 8, a displacement is measured at each point of a target object to be measured based on the center ③ of the target object. In this case, points ②, ④, and ① are each located further from the center ③, in that order. Herein, the points ②, ④, and ① are respectively separated from the center ③ by distances X1, X2, and X3 (X1<X2<X3).

Referring to FIG. 9, results of measuring a displacement per point of the target object based on the center ③ are shown. As shown in FIG. 9, it is seen that the displacement is increased closer to the center ③. As the measurement result, it is seen that when a display device or a specific layer constituting the display device is bent, the stress becomes higher at a portion closer to the bending center.

In accordance with the first exemplary embodiment, the adhesive film 300 is formed to have the first region 310 having the lower hardness than the second regions 330, to absorb or disperse the stress that is strongly generated at the bending center. As the adhesive film 300 is formed to have the hardness that is lower at the first region 310 than at the second regions 330, the stress focused on the center of the adhesive film 300 can be absorbed by the first region 310 and dispersed toward the outside.

Referring to FIG. 1, the adhesive film 300 may be formed to have a thickness in a range of 25 μm to 100 μm. However, the thickness of the adhesive film 300 may be varied depending on the size of the display device to which the adhesive film 300 is applied, without being limited thereto.

Further, the adhesive film 300 may be formed of at least one of 2-ethylhexyl acrylate (2-EHA), n-butyl acrylate (n-BA), methyl methacrylate (MMA), and acrylic acid (AAc). For example, the adhesive film 300 may be formed by mixing the acryl-based components.

Figure 2:
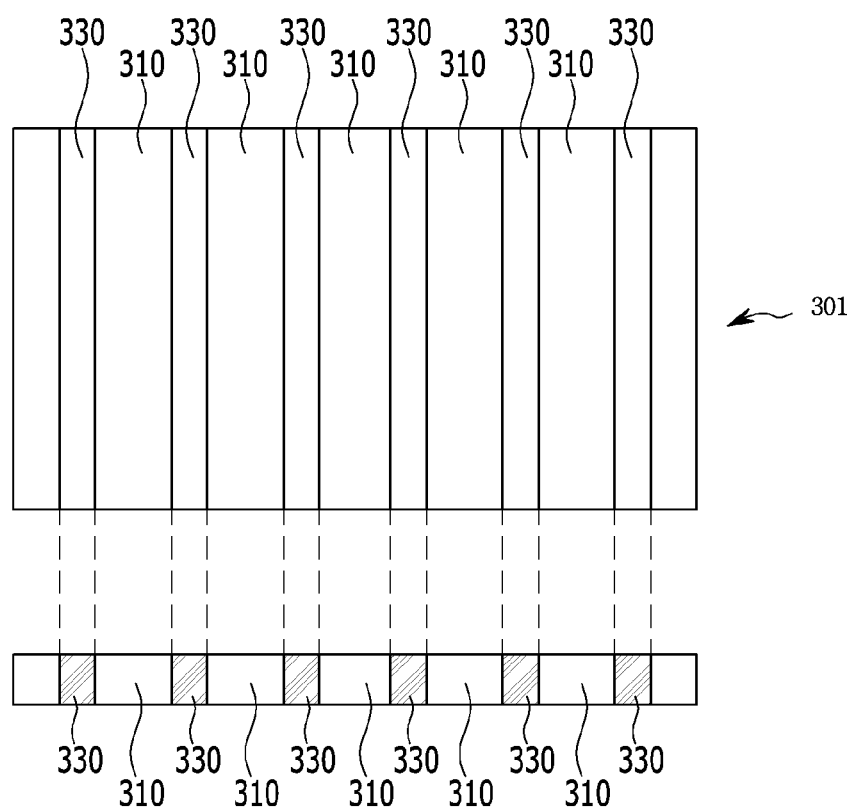
FIG. 2 is a top plan view and a cross-sectional view showing an adhesive film in accordance with a second exemplary embodiment.

Referring to FIG. 2, an adhesive film 301, in accordance with a second exemplary embodiment, may include a plurality of first and second regions 310 and 330 having different hardnesses, which are alternately disposed. The first and second regions 310 and 330 may be alternately disposed in the bending direction of the adhesive film 301.

In the adhesive film 301, bending may occur primarily at multiple different positions, instead of primarily in the center thereof. As such, as the first and second regions 310 and 330 are alternatively disposed, the bending stress can be absorbed and dispersed, even though the bending is concentrated in multiple positions.

Figure 13:
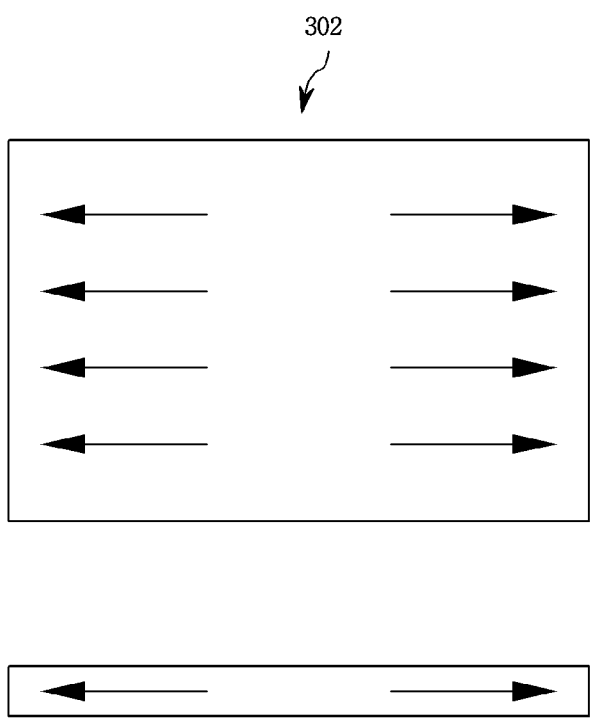
FIG. 13 is a top plan view and a cross-sectional view showing an adhesive film in accordance with a third exemplary embodiment.

Referring to FIG. 13, in accordance with a third exemplary embodiment, an adhesive film 302 may be formed to have hardness which is gradually increased from the center toward the outside. In this case, the hardness of the adhesive film 302 is gradually increased from a central portion thereof toward opposite sides of the central portion in a bending direction of the adhesive film 302.

Similar to the first exemplary embodiment, the hardness at the central portion is lower than that at the opposite side portions. However, in the third exemplary embodiment, the hardness of the adhesive film 302 is gradually increased in the bending direction thereof.

Figure 14:
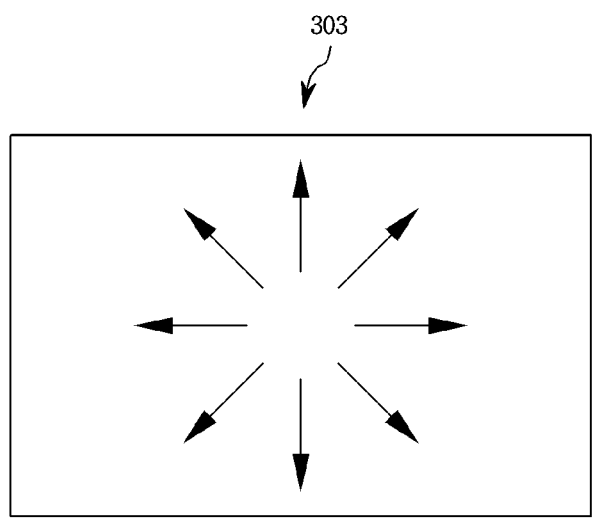
FIG. 14 is a top plan view and a cross-sectional view showing an adhesive film in accordance with a fourth exemplary embodiment.
Figure 14:
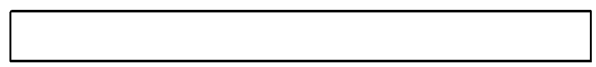

Referring to FIG. 14, in accordance with a fourth exemplary embodiment, the adhesive film 303 may be formed such that the hardness is gradually increased from the center toward the outside in a radial form.

Figure 3:
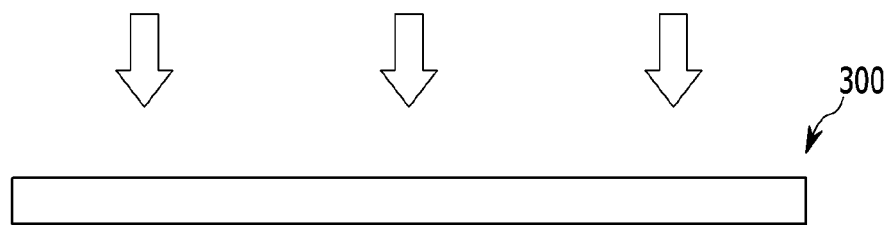
FIG. 3 and FIG. 4 show how the adhesive film shown in FIG. 1 is formed.

A manufacturing process of the adhesive film 300, in accordance with the first exemplary embodiment, will be first described with reference to FIG. 3 and FIG. 4. Referring to FIG. 3, an adhesive material is coated on a support substrate (not shown) to form an adhesive layer thereon.

Next, the adhesive material is hardened by radiating ultraviolet rays onto the entire adhesive layer. Specifically, the ultraviolet rays are entirely radiated onto the first and second regions 310 and 330 shown in FIG. 1, to harden the adhesive material. In this case, the adhesive material has uniform hardness.

Figure 4:
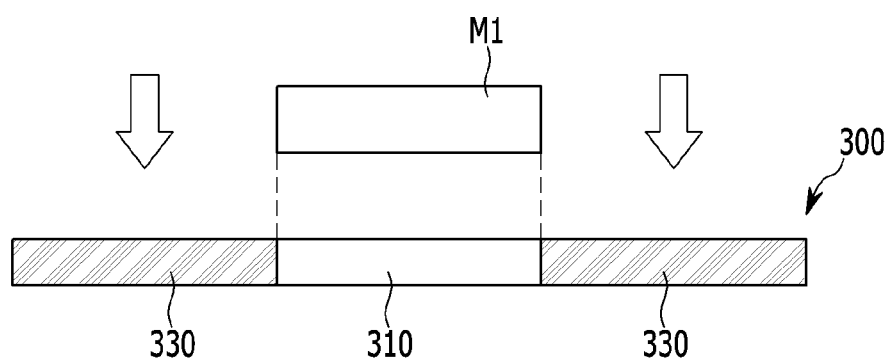

Next, as shown in FIG. 4, the ultraviolet rays are additionally radiated onto only the second regions 330 by using a first mask M1 through which the second regions 330 are exposed. In this operation, the ultraviolet rays are not radiated onto the first region 310.

Accordingly, more ultraviolet rays are radiated to the second regions 330 than the first region 310. The hardness of the adhesive material is increased as the amount of the irradiation by the ultraviolet rays is increased. As a result, the hardness of the second regions 330 is made to be higher than that of the first region 310. Accordingly, it is possible to manufacture the adhesive film 300, such that the hardness of the second region 330 is higher than that of the first region 310, as shown in FIG. 1.

Finally, the support substrate is separated from the adhesive layer. In this case, the adhesive layer may be formed to have the thickness in a range of 25 μm-100 μm. However, the thickness of the adhesive layer may be varied, depending on the size of the display device to which the adhesive layer is applied, without being limited thereto.

Further, the adhesive layer may be formed of at least one of 2-ethylhexyl acrylate (2-EHA), n-butyl acrylate (n-BA), methyl methacrylate (MMA), and acrylic acid (AAc). That is, the adhesive layer may be formed by mixing the acryl-based components.

Figure 5:
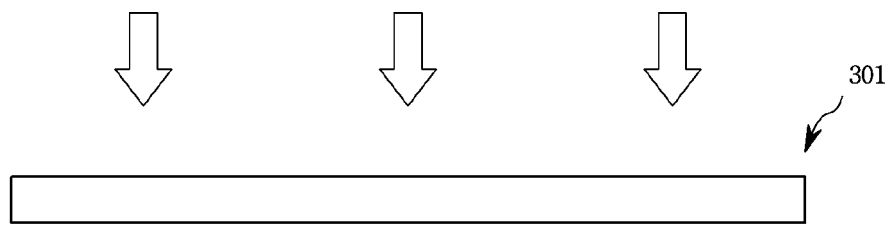
FIG. 5 and FIG. 6 show how the adhesive film shown in FIG. 2 is formed.

A manufacturing process of the adhesive film 301 in accordance with the second exemplary embodiment will be described with reference to FIG. 5 and FIG. 6. Referring to FIG. 5, an adhesive material is coated on a support substrate (not shown) to form an adhesive layer thereon.

Next, the adhesive material is hardened by radiating ultraviolet rays onto the entire adhesive layer. Specifically, the ultraviolet rays are radiated onto the first and second regions 310 and 330 shown in FIG. 2, to harden the adhesive material.

Figure 6:
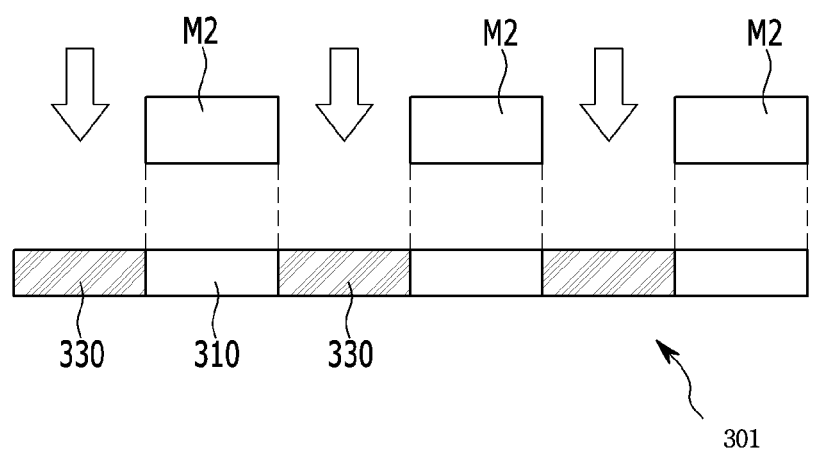

Next, as shown in FIG. 6, the ultraviolet rays are additionally radiated onto only the second region 330 by using a second mask M2 through which the second region 330 is exposed. In other words, the second region 330 of the adhesive layer may be formed by exposing portions of the adhesive layer that are spaced apart at a certain interval, by using the second mask M2. In this case, the ultraviolet rays are not radiated onto the first region 310.

In this case, the first and second regions 310 and 330 may be alternately disposed along the bending direction of the adhesive film 301. Accordingly, more ultraviolet rays are radiated to the second regions 330 than the first regions 310. The hardness of the adhesive material is increased as the amount of the irradiation is increased. As a result, the second regions 330 have a greater irradiation amount than that of the first regions 310. Thus, the hardness of the second regions 330 is increased more than that of the first regions 310.

Hereinafter, a display device to which the adhesive film 300 is applied will be described with reference to FIG. 10 to FIG. 12 in accordance with an exemplary embodiment. As the display device, an organic light emitting display device will be described. The display device of the present exemplary embodiment may be a flexible display device. However, the display device of the present exemplary embodiment is not limited thereto, and may be applied to, e.g., a liquid crystal display (LCD), a plasma display device (PDP), an electric field effect display (FED), and an electrophoretic display (EPD) device.

Figure 10:
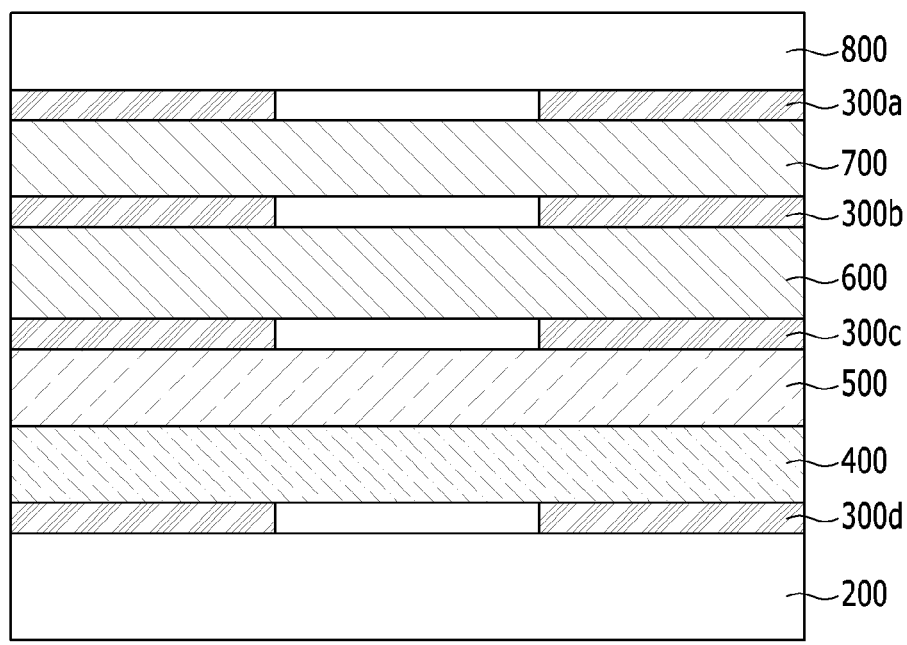
FIG. 10 is a cross-sectional view showing a display device in accordance with an exemplary embodiment.

Referring to FIG. 10, an insulating substrate 400 is formed of, for example, glass, quartz, ceramic, plastic, or the like. Further, the insulating substrate 400 may be flexible.

A protective film 200 may be provided below the insulating substrate 400. The protective film 200 is provided below the insulating substrate 400 to protect the insulating substrate 400.

A first adhesive film 300d is provided between the insulating substrate 400 and the protective film 200. Since the first adhesive film 300d corresponds to the adhesive film 300, no detailed description thereof will be provided.

The first adhesive film 300d has a strong adhesive force to couple the insulating substrate 400 and the protective film 200 to each other. In this case, the first adhesive film 300d can serve to disperse stress generated in the display device when bent as described above.

A display panel 500 is formed at an upper side of the insulating substrate 400. In accordance with the present exemplary embodiment, the display panel 500 includes an organic light emitting element.

A display panel included in the display device of the present exemplary embodiment will be described with reference to FIG. 11 and FIG. 12. Herein, the display panel may correspond to the display panel 500 shown in FIG. 10.

Figure 11:
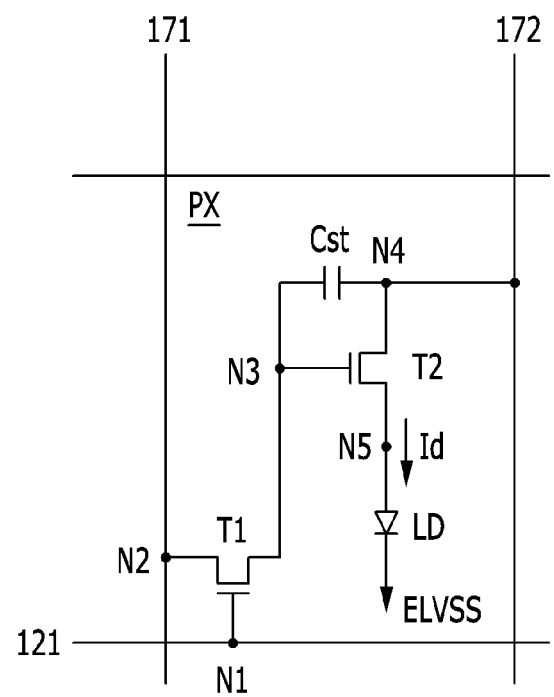
FIG. 11 is an equivalent circuit diagram showing a pixel of an organic light emitting display device.
Figure 12:
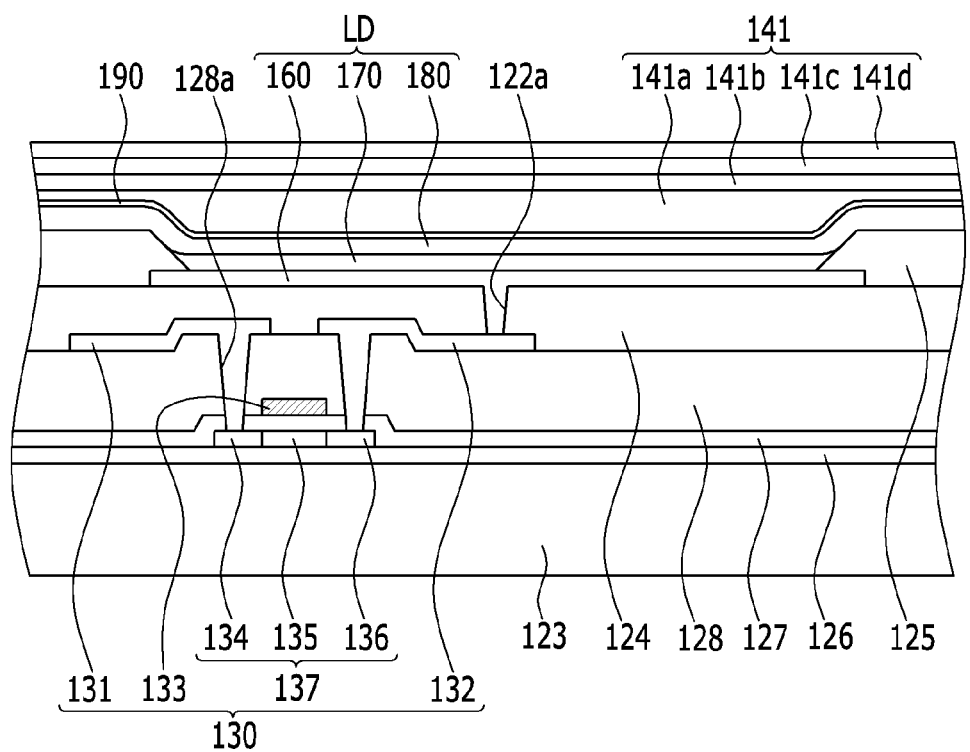
FIG. 12 is a cross-sectional view showing the organic light emitting display device.

FIG. 11 is an equivalent circuit diagram showing a pixel of an organic light emitting display device. FIG. 12 is a cross-sectional view showing the organic light emitting display device.

Referring to FIG. 11, an organic light emitting display device includes a plurality of signal lines 121, 171, and 172, and pixels PX connected thereto. The pixels PX may be any one of a red pixel R, a green pixel G, and a blue pixel B.

The signal line includes a scanning signal line 121 for transmitting a gate signal (or a scan signal), a data line 171 for transmitting a data signal, and a driving voltage line 172 for transmitting a driving voltage. The scan signal lines 121 are substantially extended in a row direction and are substantially parallel with each other, and the data lines 171 are substantially extended in a column direction and are substantially parallel with each other. The driving voltage lines 172 are shown to be substantially extended in a column direction, and they can be extended in the row direction or the column direction or formed as a mesh net.

One pixel PX includes a switching transistor T1, a driving transistor T2, a storage capacitor Cst, and an organic light emitting element LD. Although not shown in the drawing, the pixel PX may further include a thin film transistor and a capacitor, so as to compensate the current supplied to the organic light emitting element.

The switching transistor T1 includes a control terminal N1, an input terminal N2, and an output terminal N3, and the control terminal N1 is connected to the scan signal line 121, the input terminal N2 is connected to the data line 171, and the output terminal N3 is connected to the driving transistor T2. The switching transistor T1 transmits the data signal provided by the data line 171 to the driving transistor T2 in response to the scan signal provided by the scan signal line 121.

The driving transistor T2 includes a control terminal N3, an input terminal N4, and an output terminal N5, and the control terminal N3 is connected to the switching transistor T1. The input terminal N4 is connected to the driving voltage line 172. The output terminal N5 is connected to the organic light emitting element LD. The driving transistor T2 outputs an output current Id that is variable according to a voltage between the control terminal N3 and the output terminal N5.

The capacitor Cst is connected between the control terminal N3 and the input terminal N4 of the driving transistor T2. The capacitor Cst charges the data signal applied to the control terminal N3 of the driving transistor T2 and maintains the charge when the switching transistor T1 is turned off.

The organic light emitting element LD is exemplarily an organic light emitting diode (OLED), and includes an anode connected to the output terminal N5 of the driving transistor T2 and a cathode connected to the voltage Vss. The organic light emitting element LD displays the image by emitting light with different intensities depending on the output current Id of the driving transistor T2.

The organic light emitting element LD can include an organic material for emitting one or at least one of primary colors (i.e., red, green, and blue), and the organic light emitting display device displays the desired image by a spatial sum of the colors.

The switching transistor T1 and the driving transistor T2 are n-channel field effect transistors (FETs), and at least one of them can be a p-channel field effect transistor. Also, the connection between the transistors T1 and T2, the capacitor Cst, and the organic light emitting element LD is changeable.

Hereinafter, the organic light emitting display device of the present exemplary embodiment will be described with reference to the cross-section thereof shown in FIG. 12. Referring to FIG. 12, an insulating substrate 123 is formed of for example, glass, quartz, ceramic, plastic, or the like. However, the present invention is not limited thereto, and the insulating substrate 123 may also be formed as a metallic substrate made of stainless steel and the like.

A buffer layer 126 is formed on the insulating substrate 123. The buffer layer 126 serves to prevent penetration of impurities and to planarize the surface of the insulating substrate 123. The buffer layer 126 may be formed of various materials capable of performing the above-mentioned operations. As an example, one of a silicon nitride ($SiN_x$) layer, a silicon oxide ($SiO_x$) layer, and a silicon oxynitride ($SiO_xN_y$) layer may be employed as the buffer layer 126. However, the buffer layer 126 may be omitted according to type and process conditions of the insulating substrate 123.

A driving semiconductor layer 137 is formed on the buffer layer 126. The driving semiconductor layer 137 may be formed of a polysilicon film. The driving semiconductor layer 137 includes a channel region 135 in which impurities are not doped, and a source region 1134 and a drain region 136 which are doped and are formed at opposite sides of the channel region 135. In this case, the ionic material to be doped is a p-type impurity such as boron (B), and $B_2H_6$ is mainly used, for example. In this case, the impurity may be changed according to a kind of the thin film transistor.

A gate insulating layer 127 formed of a silicon nitride ($SiN_x$) or a silicon oxide ($SiO_x$) is formed on the driving semiconductor layer 137. A gate wire including a driving gate electrode 133 is formed on the gate insulating layer 127. In addition, the driving gate electrode 133 is formed to be overlapped with at least a part of the driving semiconductor layer 137, particularly, the channel region 135.

An interlayer insulating layer 128 covering the driving gate electrode 133 is formed on the gate insulating layer 127. Through holes 128a exposing the source region 134 and the drain region 136 of the driving semiconductor layer 137 are formed in the gate insulating layer 127 and the interlayer insulating layer 128. The interlayer insulating layer 128 may be formed by using a ceramic-series material, such as a silicon nitride ($SiN_x$), a silicon oxide ($SiO_x$), or the like, similar to the gate insulating layer 127.

A data wire including a driving source electrode 131 and a driving drain electrode 132 is formed on the interlayer insulating layer 128. In addition, the driving source electrode 131 and the driving drain electrode 132 are respectively connected to the source region 134 and the drain region 136 of the driving semiconductor layer 137, via through holes formed in the interlayer insulating layer 128 and the gate insulating layer 127.

As such, a driving thin film transistor 130 including the driving semiconductor layer 137, the driving gate electrode 133, the driving source electrode 131, and the driving drain electrode 132 is formed. The configuration of the driving thin film transistor 130 is not limited to the above-described examples, and may be variously changed into a known configuration which may be easily performed by those skilled the art.

A planarization layer 124 covering the data wire is formed on the interlayer insulating layer 128. The planarization layer 124 serves to planarize the interlayer insulating layer 128, in order to increase the light emitting efficiency of the organic light emitting element to be formed thereon. In addition, the planarization layer 124 has an electrode contact hole 122a exposing a part of the drain electrode 132.

The planarization layer 124 may be made of at least one of a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB).

This exemplary embodiment is not limited to the above-described configuration, and one of the planarization layer 124 and the interlayer insulating layer 128 may be omitted in some cases.

A pixel electrode 160 serving as a first electrode of the organic light emitting element is formed on the planarization layer 124. In other words, the organic light emitting display device includes a plurality of pixel electrodes 160 respectively disposed for a plurality of pixels. Herein, the pixel electrodes 160 are separated from each other. Each of the pixel electrodes 160 is connected to the drain electrode 132, through the electrode contact hole 122a of the planarization layer 124.

Further, a pixel defining layer 125 having an opening that exposes the pixel electrode 160 is formed on the planarization layer 124. That is, the pixel defining layer 125 has a plurality of openings that are individually formed for each pixel. An organic emission layer 170 may be formed for each opening formed by the pixel defining layer 125. Accordingly, a pixel region, in which each organic emission layer is formed, may be defined by the pixel defining layer 125.

In this case, the first electrode 160 is disposed so as to correspond to the opening of the pixel defining layer 125. However, the pixel electrode 160 is not necessarily disposed in the opening of the pixel defining layer 125. The pixel electrode 160 may be disposed beneath the pixel defining layer 125, so as to be partially overlapped by the pixel defining layer 125.

The pixel defining layer 170 may be made of a resin, such as a polyacrylate resin, a polyimide resin, or the like, or a silica-series inorganic material. Meanwhile, the organic emission layer 170 is formed on the pixel electrode 160. Moreover, a common electrode 180 serving as a second electrode of the organic light emitting element may be formed on the organic emission layer 170. As such, the organic light emitting element LD including the pixel electrode 160, the organic emission layer 170, and the common electrode 180 is formed.

Each of the pixel electrode 160 and the common electrode 180 may be formed of a transparent conductive material, or a semitransparent or reflective conductive material. The OLED display may be a top emission type, a bottom emission type, or a both-side emission type according to a kind of the material of the pixel electrode 160 and the common electrode 180.

A cover film 190 covering the common electrode 180 to protect it may be formed of an organic film on the common electrode 180. Further, a thin film encapsulation layer 141 is formed on the cover layer 190. The thin film encapsulation layer 141 seals and protects the organic light emitting element LD and a driving circuit portion formed on the substrate 123 from the outside.

The thin film encapsulation layer 141 includes organic encapsulation layers 141a and 141c and inorganic encapsulation layers 141b and 141d alternately laminated one by one. FIG. 12 shows a case where the two organic encapsulation layers 141a and 141c and the two inorganic encapsulation layers 141b and 141d are alternately stacked to constitute the thin film encapsulation layer 141 as an example, but it is not limited thereto.

Referring back to FIG. 10, a touch panel 600 may be provided at an upper side of the display panel 500. In this case, the touch panel 600 can sense an external touch input. A capacitive touch panel may be employed as the touch panel 600. However, the touch panel 600 is not limited thereto, and a resistive type or an electro-magnetic type of touch panel may be employed.

A second adhesive film 300c is provided between the display panel 500 and the touch panel 600. Since the second adhesive film 300c corresponds to the adhesive film 300, no detailed description thereof will be provided.

A polarizer 700 may be provided at an upper portion of the touch panel 600. The polarizer 700 converts a light axis of the light emitted through the display panel 500 to the outside. In general, the polarizing plate has a structure in which a transparent protection film is deposited on both sides or one side of a polarizer made of a polyvinyl alcohol-based resin.

In detail, the polarizing plate 700 has a structure in which polyvinyl alcohol (PVA)-based molecules chains are arranged in a predetermined direction and a triacetyl cellulose (TAC) film as the protection film is adhered to the polarizer including an iodine-based compound or a dichroic polarizer material. In this case, the polarizer and the protection film are adhered by an aqueous adhesive made of a polyvinyl alcohol-based solution. However, the polarizing plate 700 is not limited thereto, and a polarizing plate of various structures may be used.

A third adhesive film 300b is provided between the touch panel 600 and the polarizer 700. Since the third adhesive film 300b corresponds to the adhesive film 300, no detailed description thereof will be provided.

A window 800 may be provided at an upper side of the polarizer 700. Herein, the window 800 serves to protect the polarizer 700, the touch panel 600, the display panel 500, and the like which are provided below the window 800.

A fourth adhesive film 300a may be provided between the polarizer 700 and the window 800. Since the fourth adhesive film 300a corresponds to the adhesive film 300, no detailed description thereof will be provided.

As such, the display device of the present exemplary embodiment can absorb and disperse the stress generated at the center by providing adhesive films including the first and second regions with different hardness between the protective film, the substrate, the display panel, the touch panel, the polarizer, and the window when the adhesive film is bent.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. A display device comprising:
a substrate;
a protective film disposed on a first side the substrate;
a display panel disposed on an opposing second side of the substrate;
a touch panel disposed on the display panel;
a polarizer disposed on the touch panel;
a window disposed on the polarizer;
a first adhesive film disposed between the substrate and the protective film; and
a second adhesive film disposed between the display panel and the touch panel,
wherein the hardness of the first and second adhesive films gradually increases along a direction extending away from a center of the first and second adhesive films.

2. The display device of claim 1, wherein the first and second adhesive films each comprise a first region having a first hardness and second regions having a second hardness that is greater than the first hardness, and
wherein the second regions are disposed at opposing sides of the first region, with respect to a bending direction of the adhesive film.

3. The display device of claim 1, wherein the thickness of each adhesive film is in a range of 25 μm to 100 μm.

4. The display device of claim 1, wherein each adhesive film comprises at least one of 2-ethylhexyl acrylate (2-EHA), n-butyl acrylate (n-BA), methyl methacrylate (MMA), and acrylic acid (AAc).

5. The display device of claim 1, further comprising a third adhesive film disposed between the touch panel and the polarizer,
wherein the hardness of the third adhesive film gradually increases along a direction extending away from a center of the third adhesive film.

6. The display device of claim 5, further comprising a fourth adhesive film disposed between the window and the polarizer,
wherein the hardness of the third adhesive film gradually increases along a direction extending away from a center of the fourth adhesive film.

7. The display device of claim 1, wherein a first side and a second opposing side of the first adhesive film directly contact the substrate and the protective film, respectively.

* * * * *